(12) United States Patent
Horng et al.

(10) Patent No.: US 6,775,903 B2
(45) Date of Patent: Aug. 17, 2004

(54) METHOD FOR FABRICATING A TOP MAGNETORESISTIVE SENSOR ELEMENT HAVING A SYNTHETIC PINNED LAYER

(75) Inventors: Cheng T. Horng, San Jose, CA (US); Kochan Ju, Fremont, CA (US); Mao-Min Chen, San Jose, CA (US); Min Li, Fremont, CA (US); Ru-Ying Tong, San Jose, CA (US); Simon Liao, Fremont, CA (US)

(73) Assignee: Headway Technolog ( * ) Notice: Subject to any disclaimer, the term of this patent is extended or adjusted under 35 U.S.C. 154(b) by 288 days.

(21) Appl. No.: 09/953,546

(22) Filed: Sep. 17, 2001

(65) Prior Publication Data

US 2003/0053267 A1 Mar. 20, 2003

(51) Int. Cl.[7] .......................... G11B 5/127; H04R 31/00
(52) U.S. Cl. .................. 29/603.14; 29/603.07; 29/603.08; 29/603.11; 29/603.2; 360/121; 360/123; 360/126; 360/324.11; 360/324.12
(58) Field of Search ............... 29/603.07, 603.14, 29/603.08, 603.2, 603.11; 360/121, 123, 126, 324.11, 324.12

(56) References Cited

U.S. PATENT DOCUMENTS

| 6,122,150 | A | 9/2000 | Gill ..................... 360/324.11 |
|---|---|---|---|
| 6,175,476 | B1 | 1/2001 | Huai et al. ............. 360/324.11 |
| 6,201,671 | B1 | 3/2001 | Pinarbasi ............... 360/324.11 |
| 6,208,491 | B1 | 3/2001 | Pinarbasi ............... 360/324.1 |
| 6,208,492 | B1 | 3/2001 | Pinarbasi ............... 360/324.11 |
| 6,317,297 | B1 * | 11/2001 | Tong et al. ................. 360/314 |
| 6,338,899 | B1 * | 1/2002 | Fukuzawa et al. .......... 428/332 |
| 6,418,048 | B1 * | 7/2002 | Sin et al. ................... 365/173 |
| 6,447,935 | B1 * | 9/2002 | Zhang et al. .............. 428/692 |
| 6,522,507 | B1 * | 2/2003 | Horng et al. .......... 360/324.12 |

FOREIGN PATENT DOCUMENTS

JP 2000182224 A * 6/2000 ............ G11B/5/39

OTHER PUBLICATIONS

"Spin valves with synthetic ferrimagnet and antiferromagnet free and pinned layers"; Veloso, A.; Freitas, P.P.; Melo, L.V.; Magnetics, IEEE Transactions on , vol.: 35 Issue: 5 , Sep. 1999; Pages(s): 2568–2570.*

* cited by examiner

*Primary Examiner*—A. Dexter Tugbang
*Assistant Examiner*—Paul D Kim
(74) *Attorney, Agent, or Firm*—George O. Saile; Stephen B. Ackerman

(57) ABSTRACT

A method for forming top and bottom spin valve sensors and the sensors so formed, the sensors having a strongly coupled SyAP pinned layer and an ultra-thin antiferromagnetic pinning layer. The two strongly coupled ferromagnetic layers comprising the SyAP pinned layer in the top valve configuration are separated by a Ru spacer layer approximately 3 angstroms thick, while the two layers in the bottom spin valve configuration are separated by a Rh spacer layer approximately 5 angstroms thick. This allows the use of an ultra thin MnPt antiferromagnetic pinning layer of thickness between approximately 80 and approximately 150 angstroms. The sensor structure produced thereby is suitable for high density applications.

11 Claims, 2 Drawing Sheets

METHOD FOR FABRICATING A TOP MAGNETORESISTIVE SENSOR ELEMENT HAVING A SYNTHETIC PINNED LAYER

RELATED PATENT APPLICATION

This application is related to Ser. No. 09/458,727, filing date Dec. 13, 1999 now abandoned, and to related Ser. No. 09/769,813, filing date Jan. 26, 2001 now U.S. Pat. No. 6,620,530, both assigned to the same assignee as the current invention.

BACKGROUND OF THE INVENTION

1. Field of the Invention

This invention relates generally to the fabrication of a giant magnetoresistive (GMR) magnetic field sensor in a magnetic read head, more specifically to a spin valve type of GMR sensor having a synthetic antiferromagnetically pinned (SyAP) layer.

2. Description of the Related Art

One of the most commonly used structural configurations of magnetic and non-magnetic layers in giant magnetoresistive (GMR) read-heads is the so-called spin-valve magnetoresistive (SVMR) structure. In the most basic version of the SVMR, two ferromagnetic layers such as CoFe or NiFe are separated by a thin layer of electrically conducting but non-magnetic material such as Cu. One of the layers has its magnetization direction fixed in space or "pinned," by exchange coupling with an antiferromagnetic (AFM) layer, usually a layer of MnPt, directly deposited upon it. The remaining ferromagnetic layer, the unpinned or free layer, can rotate its magnetization vector in response to small variations in external magnetic fields such as are produced by moving magnetic media, (which variations do not affect the magnetization direction of the pinned layer). The rotation of one magnetization relative to the other produces changes in the resistance (magnetoresistance) of the three layer structure. A constant current sent through the SVMR then produces voltage variations across it, which are sensed by external circuitry. More germane to the present invention are newer versions of the SVMR that utilize a so-called synthetic antiferromagnetically pinned (SyAP) layer which is a tri-layered lamination comprising two ferromagnetic layers separated by a thin metallic, non-magnetic layer and wherein the two ferromagnetic layers are magnetically oriented in antiparallel directions by exchange coupling. In the SVMR configuration, this SyAP pinned layer would then be pinned by an additional antiferromagnetic material (AFM) pinning layer. Methods for fabricating several versions of this SyAP SVMR have been taught in the prior art. Gill, (U.S. Pat. No. 6,122,150) teaches a formation in which an SyAP tri-layer is formed of two 20 A layers of $Co_{90}Fe_{10}$ separated by an 8 A layer of Ru. This tri-layer is exchange coupled to an antiferromagnetic pinning layer of 425 A of NiO. Although Gill teaches several other refinements of this structure, it is the SyAP tri-layer that exemplifies the prior art for our purposes. Huai et al. (U.S. Pat. No. 6,175,476 B) teaches the formation of a SyAP pinned layer with high resistivity and improved thermal stability by using a 4–10 A Re (Rhenium) layer rather than a Ru (Ruthenium) layer as the antiferromagnetic coupling layer. Huai also teaches an annealing method for setting the domain state of the AFM pinning layer by heating the pinning layer above its blocking temperature and then cooling it in the presence of an applied magnetic field. The applied magnetic field aligns the domain state of the adjacent pinned layer which fixes the domain state of the pinning layer. Pinarbasi (U.S. Pat. No. 6,201,671) teaches the formation of a bottom SVMR sensor (a configuration in which the AFM pinning layer is vertically below the pinned and free layers) in which an NiO AFM layer is formed on a TaO seed layer for the purpose of improving the SVMR magnetoresistance (dR/R). Pinarbasi (U.S. Pat. No. 6,208,491) teaches the formation of a capping structure for a SyAP pinned layer SVMR to improve its magnetoresistance under high temperature conditions. Finally, Pinarbasi (U.S. Pat. No. 6,208,492 B1) teaches the formation of a bilayer seed structure on which is formed an antiferromagnetic pinning layer for a SyAP pinned layer.

As magnetic storage media densities increase, the shield-to-shield thickness of the SVMR must correspondingly decrease to provide the necessary resolution of the rapid magnetic flux changes. To decrease this thickness, the SVMR stack, including all layers that contribute to its operation, must itself be made thinner. Since the thickest layer in the SVMR stack is the antiferromagnetic (AFM) pinning layer (e.g. an MnPt layer of thickness exceeding 150 A for a recorded density of 30 $Gb/in^2$), it becomes desirable to reduce the thickness of that layer. Another reason that reducing the AFM pinning layer thickness would be advantageous, is that a portion of the sensing current necessary for sensor operation is shunted through the pinning layer. This current loss reduces the ultimate magnetoresistive sensitivity of SVMR operation because the shunted portion of the current is unaffected by resistance changes and cannot contribute to the voltage variations that are ultimately sensed. However, thinning the AFM layer will reduce the exchange bias energy ($J_{ex}$) between that layer and the pinned layer. In addition, it is found that the AFM pinning layer produces another disadvantageous effect, it creates hysteresis effects (open R-H loops) in the relationship between R (magnetoresistance) and H (external magnetic field). This hysteresis is due to the AFM induced anisotropy, $H_{ck}$, which leads to sensor instability. Unfortunately, when the AFM pinning layer is reduced in thickness to improve sensor resolution, the induced anisotropy is not reduced although the pinning energy is. Therefore, the hysteresis effect becomes worse.

On the other hand, a SVMR sensor for higher recording densities requires a higher pinning strength so that the smaller and more rapid external field variations can be more accurately sensed without hysteresis. We have found (and will show below), through simulations and empirical results, that AFM pinning layer thickness can, in fact, be reduced if the coupling between the two antiparallel ferromagnetic pinned layers of the SyAP, AP1 and AP2, can be improved. It is to this end that the present invention is directed.

SUMMARY OF THE INVENTION

A first object of this invention is to provide a method for forming a SVMR sensor having a thinner stack and, therefore, decreased shield-to-shield spacing.

A second object of this invention is to provide a method for forming a SVMR sensor capable of reading magnetic media with storage densities up to and exceeding 70 $Gb/in^2$.

A third object of this invention is to provide a method for forming a SVMR sensor having an enhanced GMR ratio.

A fourth object of this invention is to provide a method for forming a SVMR sensor having improved hysteresis properties.

A fifth object of this invention is to provide a method for forming a SVMR sensor having an increased ESD threshold.

A sixth object of this invention is to provide a method for forming a SVMR sensor in a manner that provides a larger annealing window (range of annealing temperatures) than is provided by methods taught within the prior art.

A seventh object is to provide the sensor so formed by the methods of the present invention.

In accord with the objects of this invention there is provided a method for forming an SVMR sensor element having a synthetic antiferromagnetically pinned (SyAP) layer and an antiferromagnetic (AFM) pinning layer wherein the AP1/AP2 coupling between the two ferromagnetic layers is improved by the use of an ultra-thin non-magnetic coupling layer and whereby the use of an extremely thin antiferromagnetic pinning layer is thereby permitted. In this context, the AP2 layer is the pinned ferromagnetic layer closest to the AFM layer, whereas the AP1 layer is the pinned ferromagnetic layer that is closest to the Cu spacer layer that separates the antiferromagnetically pinned synthetic tri-layer from the ferromagnetic free layer. Further in accord with the objects of the present invention there is provided a method for forming a SVMR sensor element in a top spin valve configuration, since the pinning field for such a top spin valve configuration is found to be stronger than that of an equivalent bottom spin valve configuration, even though the industry trend is towards the formation of bottom spin valves. Further in accord with the objects of the present invention there is provided a method for forming a synthetic antiferromagnetically pinned (SyAP) layer for such a top spin valve configuration, wherein said SyAP layer is of the form CoFe 20 A/Ru 3 A/CoFe 15 A. Because of the high (>20 kOe) saturation field, $H_s$, of this SyAP layer, usual annealing methods to fix the antiferromagnetic coupling are not possible. To achieve the objects of the present invention, therefore, a low field annealing process as set forth in related patent application HT 99-011 and fully incorporated herein by reference, is applied. Yet further in accord with the objects of this invention there is provided a method for forming a SVMR sensor of the bottom spin valve type also having the advantageous properties discussed above. Said bottom spin valve type, however, cannot use a SyAP layer with a 3 A Ru spacer due to pinhole formations, so a thicker Rh spacer layer of thickness between 4–6 A is formed. Said Rh based SyAP structure has an even greater $H_s$ than the Ru layer structure, so the low field annealing process discussed above must also be applied. The advantageousness of the present method for eliminating soft ESD damage is fully set forth in related patent application HT 00-032, which is incorporated herein in its entirety by reference.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein.

DESCRIPTION OF THE PREFERRED EMBODIMENTS

The present invention provides a method for forming both top and bottom type spin valve magnetoresistive (SVMR) read sensors having synthetic antiferromagnetically pinned (SyAP) layers (two ferromagnetic layers separated by a non-magnetic spacer layer and magnetized in mutually antiparallel directions) which are exchange coupled to a pinning layer formed of antiferromagnetic material (AFM). The novelty and advantageousness of the invention is its provision of a method for forming such a SVMR sensor with an exceptionally thin stack, which is a result of said stack having both a thin AFM pinning layer and an ultra-thin non-magnetic spacer layer separating the ferromagnetic layers in the SyAP pinned layer.

Reducing the AFM thickness, while maintaining pinning strength, has been found to be possible by improving the coupling between the two antiparallel (in magnetization) ferromagnetic layers, AP1 and AP2 through the use of ultra-thin non-magnetic spacer layers.

From simulation results we conclude that a strong coupling between AP1 and AP2 is necessary to allow the AFM to be reduced in thickness. Since it is known that using thin (<6 A) layers of non-magnetic Ru, Rh or Ir produces a larger exchange coupling energy than a Ru7.5 A (angstrom) layer, we should expect that a more effective SVMR sensor can be made using such thin layers of these materials.

Figure 1:
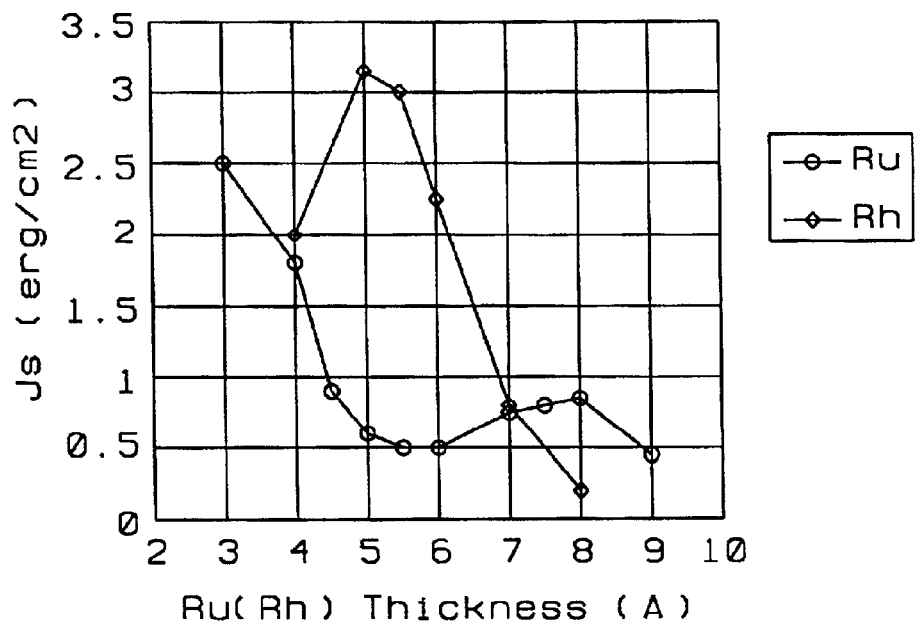
FIG. 1 is a graph of exchange coupling energy, $J_s$, for the SyAP as a function of Ru and Rh spacer thickness.

Referring to FIG. 1, therefore, there is shown graphical evidence of the effect of reducing the thickness of Ru and Rh spacers in the SyAP layer. As can be seen, a Ru spacer of thickness between 3–4 A, or a Rh spacer of thickness between 4–6 A, each provide a higher coupling energy than a Ru7.5 A spacer. The highest coupling field produced by Ru is at 3 A, while the highest coupling field produced by Rh is at 5 A.

Based on these results, a top spin valve comprising a SyAP layer of the form: CoFe 20 A/Ru 3 A/CoFe 15 A was fabricated. In manufacturing the more usual SyAP spin valve configuration with a Ru7.5 A spacer (CoFe 20 A/Ru 7.5 A/CoFe 15 A) which has a measured saturation field $H_s$=6.0 kOe, an annealing field of 10 kOe can be used. Because the saturation field of the Ru 3 A spin valve is much higher (>20 kOe), the annealing must be done using another method, the low field annealing process. This low field annealing process is set forth completely in related patent application HT 99-011, which is incorporated herein in its entirety by reference.

We conclude that the experimental results confirm the simulations and that with strong coupling through a thin, Ru 3 A spacer layer, the MnPt layer can be reduced in thickness without sacrificing, and even improving, pinned layer integrity and performance.

Figure 2:
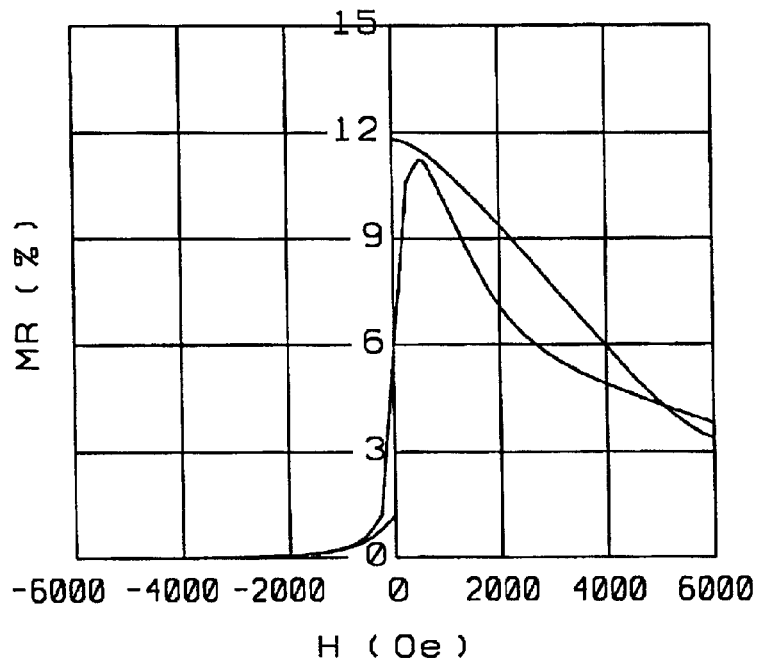
FIG. 2 shows a measured R-H graph of a bottom SyAP SVMR structure: NiCr55 A/MnPt100 A /CoFe15 A/Ru3 A/CoFe20 A/Cu20 A/CoFe 10 A/NiFe20 A/Ru5 A/Ta20 A. The poor hysteresis illustrates the fact that the Ru3 A spacer is too thin.

Recently there has been an industry trend towards using the bottom spin valve (BSV) configuration. For an equivalent pinned layer structure to that of the top spin valve (TSV) type, it is found that the pinning field for the bottom spin valve is much smaller than that of the top spin valve. For example, the pinning fields measured for a TSV configuration:

NiCr/NiFe/CoFe/Cu/CoFe20 A/Ru7.5 A/CoFe15 A/MnPt 150 A and a BSV configuration:

NiCr/MnPt150 A/CoFe15 A/Ru7.5 A/CoFe20 A/Cu/CoFe/NiFe respectively, are 3200 Oe and 2100 Oe. The pinning fields for SyAP structures made with a Ru 3 A spacer are, respectively, about 6000 Oe and 2600 Oe. Referring to FIG. 2, there is shown the R-H loop for the Ru 3 A SyAP BSV, indicating a very large loop opening. It is believed from this result that growing a Ru 3 A spacer layer, which is less than two mono-layers thick, in the BSV configuration, produces a layer with pinholes.

As is indicated in FIG. 2, a Ru 3 A spacer layer is too thin for use in a bottom SyAP spin valve. In the present invention we propose the use of a Rh 5 A spacer layer for the bottom SyAP spin valve. Since the saturation field, $H_s$, of the Rh 5 A SyAP bottom spin valve structure is even higher than that of the Ru 3 A SyAP top spin valve structure, the bottom spin valve structure must be annealed by the low field annealing process of related patent application HT 99-011, incorporated herein in its entirety by reference.

To verify the conclusions relating to MnPt thicknesses reached above by simulations, two SyAP configurations were fabricated and tested. These configurations were:

NiCr/MnPt(x)/CoFe/Ru7.5 A/CoFe/Cu/CoFe/NiFe/Ru/Ta: x=100, 120, 150, 175 A

NiCr/MnPt(x)/CoFe/Rh5 A/CoFe/Cu/CoFe/NiFe/Ru/Ta: x=80, 100, 150 A, where the first Ru7.5 A configuration served as a reference.

To verify the efficacy of low field annealing, SyAP structures:

CoFe15 A/Ru3 A/CoFe20 A (TSV)

CoFe15 A/Rh5 A/CoFe20 A (BSV)

were fabricated and studied.

Figure 3:
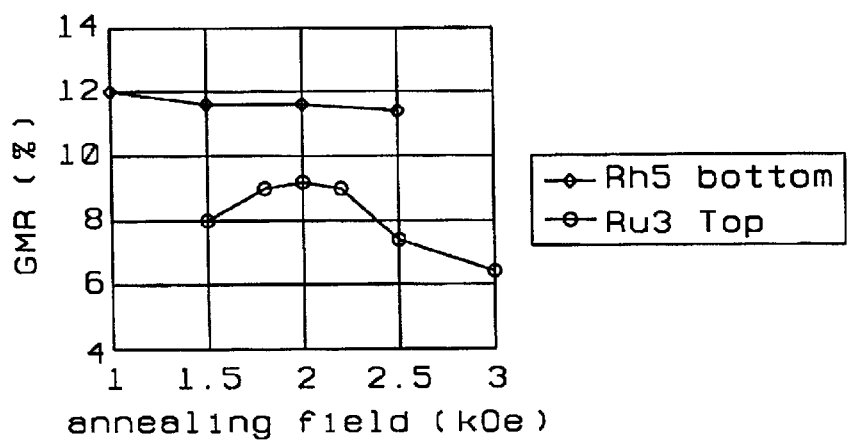
FIG. 3 is a graph showing the low field annealing window (usable annealing fields to maintain high GMR ratio) for top Ru3 A and bottom Rh5 A spin valves.

Referring to FIG. 3, there is shown low field annealing data for the two fabrications. Comparing the Ru to the Rh cases, it can be seen that the Rh has a larger annealing window because the Rh structure has a larger coupling energy than the Ru structure. For the Rh bottom spin valves an annealing field of 2000 Oe was used.

Figure 4A:
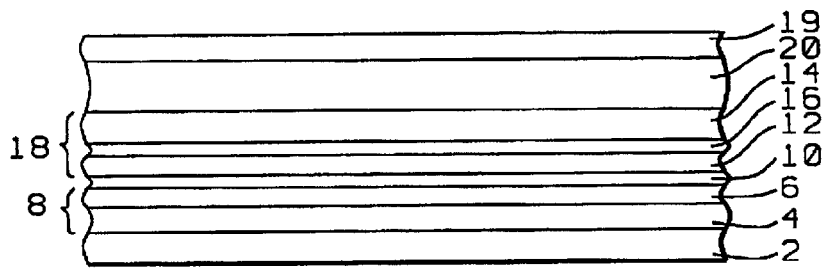
FIGS. 4a and 4b are schematic drawings of top and bottom spin valve sensor stacks formed according to the method of the present invention.
Figure 4B:
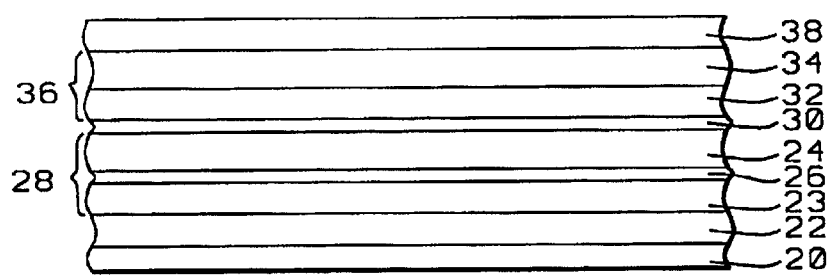

Referring finally to FIGS. 4a and 4b, there is shown a schematic diagram of the stack layer formation for a top spin valve SyAP (4a) formed in accordance with the present invention and for a bottom spin valve SyAP (4b) formed in accordance with the present invention. FIG. 4a shows an NiCr seed layer (2), formed to a thickness of between approximately 45 and 60 A (angstroms), which is found to enhance such magnetoresistive properties of the sensor as layer smoothness and thermal stability, over which is formed a first ferromagnetic free layer (8) which is a bilayer comprising an NiFe layer (4) formed to a thickness of between approximately 0 A and 50 A over which is formed a CoFe layer (6) of thickness between approximately 5 A and 30 A. Over this free layer (8) there is then formed a metallic, non-magnetic spacer layer (10), which in this example is a Cu layer formed to a thickness of between 16 A and 25 A. This spacer layer separates the free layer from the pinned layer. Over the Spacer layer is then formed the pinned layer (18), which is a tri-layer comprising first (12) and second (14) ferromagnetic layers, designated AP1 and AP2, separated by a thin metallic, non-magnetic spacer layer (16). In this example the first ferromagnetic layer, AP1, (12) is a layer of CoFe formed to a thickness of between approximately 10 A and 25 A and the second ferromagnetic layer, AP2, (14) is a layer of CoFe formed to a thickness of between approximately 10 A and 25 A. The spacer layer (16) is a layer of Ru, which is formed to a thickness of between approximately 3 and 4 A, but is most advantageously formed to a thickness of approximately 3 A. This ultra thin Ru layer provides a strong coupling between the two ferromagnetic layers allowing them to be given antiparallel magnetizations and coupled into a layer (18) (a SyAP layer) which will be antiferromagnetically pinned by the antiferromagnetic layer (20) that is subsequently formed. The said antiferromagnetic pinning layer (20), which is a layer of MnPt, is then formed on the pinned layer (18) with a thickness of between approximately 80 A and 150 A. Note that the designation "AP2" always refers to the ferromagnetic layer in closest proximity to the pinning layer. A capping layer (19), which can be a layer of NiCr or NiFeCr between approximately 20 A–30 A thick, may be formed on the antiferromagnetic pinning layer. A low field annealing process in a magnetic field of approximately 2,000 Oe completes the formation and antiferromagnetically pins the SyAP tri-layer (18) to the MnPt antiferromagnetic pinning layer (20). The extreme thinness of the MnPt layer (20) is largely responsible for the thinness of the entire formation, which is necessary for a sensor having the resolution necessary for reading high density magnetic storage media. As was pointed out in the earlier discussion, it is the strong coupling between the two antiparallel ferromagnetic layers (12)&(14), mediated by the ultra-thin Ru layer (16) that allows the formation of such a thin pinning layer.

Referring next to FIG. 4b, there is shown a bottom spin valve formation formed in accordance with the present invention and also displaying the advantageous thinness that is provided by a strongly coupled SyAP pinned layer and a thin MnPt pinning layer. An antiferromagnetic pinning layer of MnPt (22) is first formed on an NiCr seed layer (20), of thickness between approximately 45 and 60 angstroms, which seed layer is found to enhance the magnetoresistive properties of the sensor. The MnPt layer is formed to a thickness of between approximately 80 A and 150 A. On the pinning layer is then formed a pinned layer (28), which is a tri-layer comprising a first (24) and second (23) ferromagnetic layer, denoted AP1 and AP2 respectively, separated by a thin metallic, non-magnetic spacer layer (26). In this example the first ferromagnetic layer, AP1, (24) is a layer of CoFe formed to a thickness of between approximately 10 A and 25 A and the second ferromagnetic layer (23) is a layer of CoFe formed to a thickness of between approximately 10 A and 25 A. The spacer layer (26) is a layer of Rh, which is formed to a thickness of between approximately 4 and 6 A, but, for strongest coupling, is most advantageously formed to a thickness of approximately 5 A. This ultra thin Rh layer provides a strong coupling between the two ferromagnetic layers allowing them to be given antiparallel magnetizations and be coupled into an SyAP layer (28) that is antiferromagnetically pinned by the antiferromagnetic layer (22) that is first formed. A metallic, non-magnetic spacer layer (30) is then formed on the AP1 layer (24) of the pinned layer (28), said spacer layer in this example being a layer of Cu formed to a thickness of between approximately 16 A and 25 A. Over the spacer layer is formed a ferromagnetic free layer (36), which can be a bilayer comprising a layer of CoFe (32) formed to a thickness of between approximately 5 A and 30 A and over which is then formed a layer of NiFe (34) formed to a thickness of between approximately 0 A and 50 A. A capping layer (38), which can be a layer of Ta or TaO, formed to a thickness of between approximately 5 A and 20 A is then formed over the free layer (36). The fabrication is then annealed in a low strength magnetic field of approximately 2,000 Oe, to provide the necessary antiferromagnetic coupling between the pinned layer and the pinning layer. As is the case with the top spin valve of FIG. 4a, this bottom spin valve also has the advantageous property of extreme thinness necessary for resolving magnetic data stored at high densities.

As is understood by a person skilled in the art, the preferred embodiment of the present invention is illustrative of the present invention rather than limiting of the present invention. Revisions and modifications may be made to methods, materials, structures and dimensions employed in practicing the method of the present invention, while still remaining in accord with the spirit and scope of the present invention as defined by the appended claims.

What is claimed is:

1. A method for fabricating a top spin valve magnetoresistive (SVMR) sensor element having a synthetic, strongly coupled antiferromagnetically pinned (SyAP) tri-layer and thin antiferromagnetic pinning layer, suitable for high linear density applications, comprising:

providing a substrate;

forming on the substrate a seed layer to enhance giant magnetoresistive properties of subsequently formed sensor elements;

forming on said seed layer a first ferromagnetic layer, which will be a ferromagnetic free layer;

forming on said first ferromagnetic layer a first metallic, non-magnetic spacer layer;

forming on said first spacer layer a second ferromagnetic layer (AP1);

forming on said second ferromagnetic layer a second metallic, non-magnetic spacer layer of Ru, formed to a thickness between approximately 3 and 4 angstroms or Rh, formed to a thickness between approximately 4 and 6 angstroms, which is of sufficient thinness to provide strong antiferromagnetic coupling thereby of said second ferromagnetic layer to a third ferromagnetic layer;

forming on said strong coupling second non-magnetic spacer layer said third ferromagnetic layer (AP2), which will be strongly coupled to the second ferromagnetic layer through said second spacer layer, forming, thereby, said synthetic, strongly coupled antiferromagnetically pinned (SyAP) tri-layer having antiparallel magnetizations;

forming on said third ferromagnetic layer (AP2) a thin antiferromagnetic pinning layer of MnPt, NiMn, IrMn or MnPdPt, formed to a thickness of between approximately 80 angstroms and approximately 150 angstroms;

forming on said antiferromagnetic pinning layer a capping layer;

annealing said structure in a low external magnetic field and thereby strongly antiferromagnetically pinning said antiferromagnetic layer to said synthetic, strongly coupled antiferromagnetically pinned (SyAP) tri-layer.

2. The method of claim 1 wherein the seed layer is a layer of NiCr or NiFeCr formed to a thickness of between approximately 45 angstroms and approximately 65 angstroms.

3. The method of claim 1 wherein the first ferromagnetic layer is a laminated bilayer comprising a layer of NiFe formed to a thickness of between up to approximately 50 angstroms on which is formed a layer of CoFe formed to a thickness of between approximately 5 angstroms and approximately 30 angstroms.

4. The method of claim 1 wherein the first metallic, non-magnetic spacer layer is a layer of metallic, non-magnetic material chosen from the group consisting of Cu and CuAg and is formed to a thickness of between approximately 16 angstroms and approximately 25 angstroms.

5. The method of claim 1 wherein the second ferromagnetic layer (AP1) is a layer of the ferromagnetic material of CoFe or CoFeB.

6. The method claim 1 wherein the second ferromagnetic layer (AP1) is a layer of CoFe and is formed to a thickness of between approximately 10 angstroms and approximately 25 angstroms.

7. The method of claim 1 wherein the third ferromagnetic layer (AP2) is a layer of ferromagnetic material chosen from the group consisting of CoFe and CoFeB.

8. The method of claim 1 wherein the third ferromagnetic layer (AP2) is a layer of CoFe formed to a thickness of between approximately 10 angstroms and approximately 25 angstroms.

9. The method of claim 1 wherein the capping layer is a layer of NiCr or NiFeCr formed to a thickness of between approximately 20 angstroms and approximately 30 angstroms.

10. The method of claim 1 wherein the second non-metallic spacer layer is Ru and the fabrication is annealed in an external field between approximately 1,750 Oe and approximately 2,250 Oe.

11. The method of claim 1 wherein the second non-metallic spacer layer is Rh and the fabrication is annealed in an external field between approximately 1,000 Oe and approximately 2,500 Oe.

* * * * *

UNITED STATES PATENT AND TRADEMARK OFFICE
CERTIFICATE OF CORRECTION

PATENT NO. : 6,775,903 B2  
DATED : August 17, 2004  
INVENTOR(S) : Cheng T. Horng et al.

It is certified that error appears in the above-identified patent and that said Letters Patent is hereby corrected as shown below:

<u>Title page,</u>  
Item [73], Assignee, delete "Headway Technolog" and replace it with -- Headway Technologies, Inc., Milpitas, CA (US) --.

Signed and Sealed this

Seventh Day of June, 2005

JON W. DUDAS  
*Director of the United States Patent and Trademark Office*